(12) United States Patent
Jun et al.

(10) Patent No.: US 10,710,598 B2
(45) Date of Patent: Jul. 14, 2020

(54) APPARATUS AND METHOD FOR PROVIDING DISTANCE TO EMPTY

(71) Applicants: HYUNDAI MOTOR COMPANY, Seoul (KR); KIA MOTORS CORPORATION, Seoul (KR)

(72) Inventors: Jong-Chan Jun, Incheon (KR); Deok-Hwan Seo, Incheon (KR); Kwon-Hyoung Choi, Suwon-Si (KP); Jin-Hyung Lee, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/205,688

(22) Filed: Nov. 30, 2018

(65) Prior Publication Data

US 2020/0079390 A1  Mar. 12, 2020

(30) Foreign Application Priority Data

Sep. 6, 2018  (KR) .......................... 10-2018-0106374

(51) Int. Cl.
*B60W 40/12*  (2012.01)
*B60L 58/13*  (2019.01)
(Continued)

(52) U.S. Cl.
CPC ............ *B60W 40/12* (2013.01); *B60L 58/13* (2019.02); *B60W 50/14* (2013.01); *G01R 31/371* (2019.01); *G01R 31/382* (2019.01); *B60L 2250/16* (2013.01); *B60W 2050/146* (2013.01); *B60W 2510/244* (2013.01); *B60W 2540/30* (2013.01); *B60W 2555/20* (2020.02); *B60Y 2200/91* (2013.01); *B60Y 2200/92* (2013.01)

(58) Field of Classification Search
CPC ................ B60W 40/12; B60W 50/14; B60W 2050/146; B60W 2510/244; B60W 2540/30; B60W 2550/12; G01R 31/382; G01R 31/371; B60L 58/13; B60L 2250/16; B60Y 2200/91; B60Y 2200/92
USPC ......................................................... 701/22
See application file for complete search history.

(56) References Cited

U.S. PATENT DOCUMENTS

2015/0239455 A1* 8/2015 Qiu .......................... B60L 3/12
                                                          701/22
2016/0061610 A1* 3/2016 Meyer ..................... B60L 58/12
                                                          701/22
(Continued)

FOREIGN PATENT DOCUMENTS

| KR | 10-2013-0051132 A | 5/2013 |
| KR | 10-2014-0095780 A | 8/2014 |
| KR | 10-1683523 B1 | 12/2016 |

*Primary Examiner* — Marthe Y Marc-Coleman
(74) *Attorney, Agent, or Firm* — Morgan, Lewis & Bockius LLP (57) ABSTRACT

An apparatus for providing Distance To Empty (DTE) includes: a sensor for generating environmental condition information; a battery control unit for generating battery available energy according to battery state information by sensing a battery; and a vehicle control unit for generating an available energy dual map having the battery available energy and converted available energy generated by reflecting the environmental condition information, and for calculating DTE according to the available energy dualization map.

18 Claims, 5 Drawing Sheets

(51) Int. Cl.
    *G01R 31/371*     (2019.01)
    *B60W 50/14*     (2020.01)
    *G01R 31/382*     (2019.01)

(56) References Cited

U.S. PATENT DOCUMENTS

2017/0072181 A1*   3/2017   Witt ................... A61M 39/1011
2018/0072181 A1*   3/2018   Christen ............. H01M 10/488

* cited by examiner

APPARATUS AND METHOD FOR PROVIDING DISTANCE TO EMPTY

CROSS-REFERENCE TO RELATED APPLICATION

This application claims priority to Korean Patent Application No. 10-2018-0106374 filed on Sep. 6, 2018 in the Korean Patent Office, which is incorporated herein by reference in its entirety.

TECHNICAL FIELD

The present disclosure relates to an electric vehicle, and more particularly, to an apparatus and a method for providing a Distance To Empty (DTE) capable of displaying the DTE and then predictably calculating the DTE.

BACKGROUND

Generally, a Distance To Empty (DTE) is obtained by multiplying fuel efficiency (km/kWh) by available energy (kWh). In this time, since the fuel efficiency and the available energy value are also values obtained through estimation, the more accurately the estimation of each factor becomes, the more accurately the estimated value of the Distance To Empty becomes.

Accordingly, in many situations, the accuracy of the Distance To Empty (DTE) is inevitably low. For example, it can be a case of driving the uphill road immediately after driving the downhill road (a suddenly changed learning fuel efficiency value), a case of alternating a driver who drives to learn good fuel efficiency with a different driver who has a bad driving habit (an inaccurate learning fuel efficiency), a case that a vehicle cold-soaked drives in a high-temperature region (an inaccurate available energy value), etc.

As described above, the predictability of the value of the DTE can be changed according to the situation, and when the value changes suddenly, a driver can particularly have a fear of driving at low SOC. For example, there can be a case that the DTE is suddenly changed at the low SOC. That is, the location that was marked as the place that can drive on the DTE is changed to the location that cannot reach suddenly.

In addition, when the DTE displays a remaining certain value well but displays as there is nothing suddenly (e.g., '---'), the dangerous situation that a driver misunderstands it as the inability to drive and does not drive a vehicle anymore can occur although the driver can actually drive a little more.

The contents described in Description of Related Art are to help the understanding of the background of the present disclosure, and can include what is not previously known to those skilled in the art to which the present disclosure pertains.

SUMMARY OF THE DISCLOSURE

The present disclosure is intended to solve the problems, and an object of the present disclosure is to provide an apparatus and a method for providing a Distance To Empty (DTE), which can display the DTE and then predictably calculating the DTE.

In addition, another object of the present disclosure is to provide an apparatus and a method for providing a DTE, which can reflect a driver's propensity and/or driving environment to calculate the DTE.

In addition, yet another object of the present disclosure is to provide an apparatus and a method for providing a DTE, which can solve a dangerous situation problem caused by a driver's misunderstanding, and secure the stability while maintaining accuracy thereof.

In order to achieve the objects, the present disclosure provides an apparatus and a method for providing a DTE, which can display the DTE and then predictably calculate the DTE.

An apparatus for providing Distance To Empty can include: a sensor for generating environmental condition information; a battery control unit for generating battery available energy according to battery state information by sensing a battery; and a vehicle control unit for generating an available energy dual map having the battery available energy and converted available energy generated by reflecting the environmental condition information and calculating DTE according to the available energy dualization map.

The vehicle control unit can set a dualization branching point for obtaining margin energy so that additional driving is possible by a predetermined certain distance on a dualization curve according to the available energy dualization map.

The dualization branching point can be set to be lower than a current total amount of the battery upon full charging.

A dualization starting point where the dualization branching point is started can be changed according to the environmental condition information.

A dualization starting point where the dualization branching point is started can be a point where the battery available energy is the maximum value by reflecting the environmental condition information.

The slope of the dualization curve can be determined by driving propensity information.

The driving propensity information can be any one of a driving pattern, average learning fuel efficiency for each driver, and a Vehicle and Driver Management System (VDMS).

The environmental condition information can be external temperature.

The Distance To Empty can be calculated by using learning fuel efficiency according to driving of a vehicle and the converted available energy.

The apparatus for providing the Distance To Empty can further include a display for displaying the Distance To Empty.

Another embodiment of the present disclosure can provide a method for providing Distance To Empty including generating environmental condition information using a sensor; generating battery available energy according to battery state information by sensing a battery by a battery control unit; generating an available energy dual map having the battery available energy and converted available energy generated by reflecting the environmental condition information by a vehicle control unit; and calculating DTE according to the available energy dual map by the vehicle control unit.

The calculating the Distance To Empty can include setting a dualization branching point for obtaining margin energy so that additional driving is possible by a predetermined certain distance on a dualization curve according to the available energy dual map by the vehicle control unit.

The calculating the Distance To Empty can further include displaying the Distance To Empty on a display.

According to the present disclosure, it is possible to prevent the case where a driver misunderstands it as the inability to drive when no Distance To Empty (DTE) (e.g., '---') is displayed.

In addition, as another effect of the present disclosure, it is possible to provide an alternative system for safety situation so that a driver can find the place to stop even in an emergency by obtaining margin energy of the battery that can drive a certain distance after displaying 'None' ('---'). It is possible to reflect the driver's propensity (learning fuel efficiency for each driver) so that the driver can drive a certain distance even if the driver's driving pattern is different.

In addition, it is possible to reflect environmental information (e.g., external temperature) so that the dualization timing is lower than the current total energy of the battery even in a bad condition such as charging at a low temperature, thus maximally maintaining the accuracy for the conventional DTE. That is, as the external temperature is lowered, the total amount of battery upon full charging can be lowered, and accordingly, the dualization timing can be also lowered together according to the external temperature, thus maintaining the initial accuracy of the DTE.

DESCRIPTION OF SPECIFIC EMBODIMENTS

Various modifications and various embodiments can be made in the present disclosure, so that specific embodiments are illustrated in the drawings and described in detail in the specification. It should be understood, however, that it is not intended to limit the present disclosure to the particular disclosed forms, but includes all modifications, equivalents, and alternatives falling within the sprit and technical scope of the present disclosure.

Like reference numerals are used for like elements in describing each drawing. The terms "first," "second," and the like can be used to illustrate various components, but the components should not be limited by the terms. The terms are used only to differentiate one component from another component.

For example, a first component can be referred to as a second component, and similarly, the second component can be also referred to as the first component without departing from the scope of the present disclosure. The terms "and/or" includes a plurality of related listed items or any of a plurality of related listed items.

Unless otherwise defined, all terms including technical and scientific terms used herein have the same meaning as commonly understood by one of ordinary skill in the art to which the present disclosure belongs.

It will be further understood that terms, such as those defined in commonly used dictionaries, should be additionally interpreted as having a meaning that is consistent with their meaning in the context of the relevant art, and will not be interpreted in an idealized or overly formal sense unless expressly so defined in the application.

Hereinafter, an apparatus and a method for providing a Distance To Empty in accordance with an embodiment of the present disclosure will be described in detail with reference to the accompanying drawings.

Figure 1:
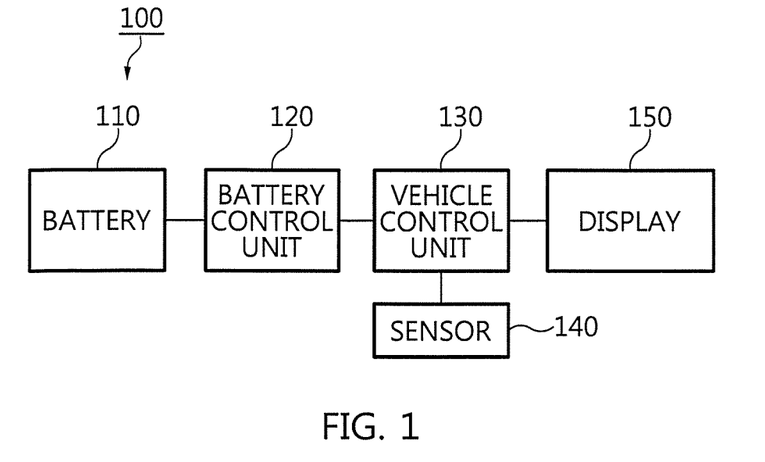
FIG. 1 is a block diagram illustrating an apparatus for providing a Distance To Empty in accordance with an embodiment of the present disclosure.

FIG. 1 is a block diagram of an apparatus for providing a Distance To Empty (DTE) in accordance with an embodiment of the present disclosure. Referring to FIG. 1, the apparatus 100 may include a battery 110, a battery control unit (BCU) 120 for sensing the battery 110 to generate battery available energy according to battery state information, a sensor 140 for generating environmental condition information, a vehicle control unit 130 such as an electronic control unit (ECU) for calculating the DTE, a display 150 for displaying the DTE, etc.

The battery 110 can include a battery cell (not illustrated) connected in series and/or in parallel, and the battery cell can be a high voltage battery cell for an electric vehicle such as a nickel metal battery cell, a lithium ion battery cell, a lithium polymer battery cell, and a solid state battery cell. Generally, the high-voltage battery is a battery used as a power source for operating an electric vehicle and refers to a high voltage of 100V or more. However, it is not limited thereto, and a low voltage battery is also possible.

The battery cell can be designed as a cylindrical cell, a prismatic cell, a pouch-shaped cell, etc. The pouch-shaped cells include a flexible cover composed of a thin film, and the electrical components of the battery cell are located in the cover.

Particularly, the pouch-shaped cells are used in order to implement an optimum space use in one battery cell. The pouch-shaped cells also have low weight as well as high capacity.

The edges of the above-described pouch-shaped cells include a sealing joint (not illustrated). That is, the sealing joint connects two thin films of the battery cells, and the thin films include additional components within the cavity portion formed thereby.

Generally, the pouch-shaped cells can contain an electrolytic solution, such as a lithium secondary battery or a nickel-hydrogen battery.

The battery control unit 120 is a Battery Management System (BMS), which optimizes battery management, thus enhancing energy efficiency and extending life span thereof. It is possible to monitor the voltage, current, temperature, etc. of the battery in real time to generate battery state information, generates battery available energy thereby, and prevents excessive charging and discharging in advance, thus enhancing the safety and reliability of the battery. For this purpose, a circuit, a microprocessor, etc. are configured therein.

The vehicle control unit 130 can be a Hybrid Control Unit (HCU), a Vehicle Control Unit (VCU), etc., and can be separately configured therefrom to be connected to a communication line as well. The vehicle control unit 130 reflects the environmental condition information collected through the sensor 140 to generate converted available energy. In addition, the vehicle control unit 130 generates an available energy dual map having the battery available energy and converted available energy generated by the battery control unit 120, and calculates a DTE according to the available energy dualization map. In addition, the vehicle control unit 130 displays the DTE through the display 150.

The sensor 140 can be a temperature sensor, a current sensor, a voltage sensor, etc. that are installed inside or outside the vehicle. Particularly, the sensor 140 measures the external temperature to generate environmental condition temperature using the temperature sensor.

The display 150 displays a DTE, driving information, etc. to a driver. The display 150 can be a Liquid Crystal Display (LCD), a Light Emitting Diode (LED) display, an Organic Light Emitting Diode (OLED) display, a touch screen, a flexible display, a Head Up Display (HUD), etc.

Figure 2:
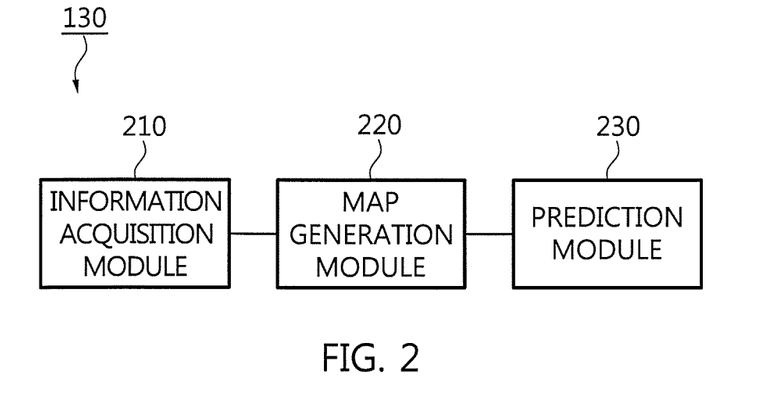
FIG. 2 is a detailed block diagram of a vehicle control unit illustrated in FIG. 1.

FIG. 2 is a detailed block diagram of the vehicle control unit 130 illustrated in FIG. 1. Referring to FIG. 2, the vehicle control unit 130 can be configured to include an information acquisition module 210 for acquiring the battery available energy, the environmental condition information, etc., a map generation module 220 for reflecting the environmental condition information, etc. to generate the converted available energy and generating the available energy dual map having the converted available energy and the battery available energy, a prediction module 230 for predicting the DTE according to the available energy dualization map, etc.

The term " . . . module" in FIG. 2 means a unit for processing at least one function or operation, which can be implemented by a combination of software and/or hardware.

The hardware can be implemented by an Application Specific Integrated Circuit (ASIC) designed for performing the above function, a Digital Signal Processing (DSP), a Programmable Logic Device (PLD), a Field Programmable Gate Array (FPGA), a processor, a controller, a microprocessor, another electronic unit or a combination thereof. The software can be implemented by a module for performing the above function. The software can be stored in a memory unit, and executed by a processor. The memory unit or the processor can adopt various means well known to those skilled in the art.

Figure 3:
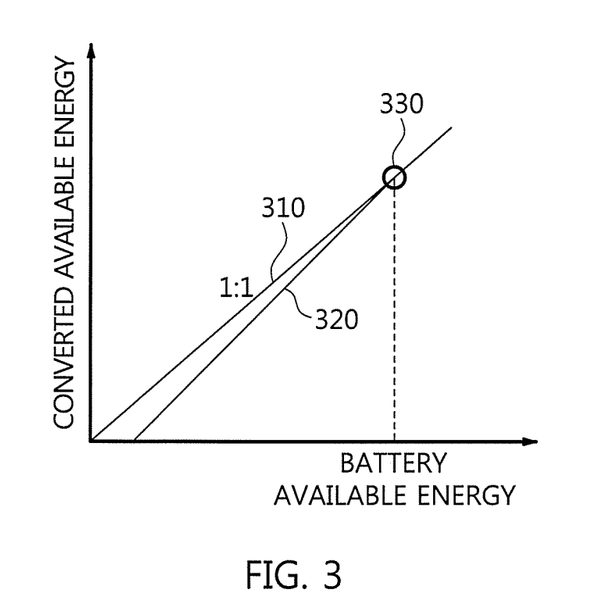
FIG. 3 is a conceptual diagram of the setting of a dualized branching point in accordance with an embodiment of the present disclosure.

FIG. 3 is a conceptual diagram of the setting of a dualized branching point in accordance with an embodiment of the present disclosure. A general DTE (DTE) is determined by the following equation.

$$\text{DTE (km)} = \text{Fuel efficiency (km/kWh)} \times \text{Available energy (kWh)} \quad \text{Equation 1}$$

Herein, the fuel efficiency (km/kWh) refers to the learning fuel efficiency of the vehicle, and the available energy (kWh) uses a value of the battery available energy. In addition, the available energy is a value indicating a value of the remaining State Of Charge (SOC) of the battery 110.

However, rather than using the conventional battery available energy as it is in accordance with an embodiment of the present disclosure, an intermediate parameter called 'converted available energy' has been proposed and used as an available energy value in the DTE calculation. That is, the DTE is determined by the following equation.

$$\text{DTE (km)} = \text{Fuel efficiency (km/kWh)} \times \text{Converted available energy (kWh)} \quad \text{Equation 2}$$

Herein, the converted available energy is a value generated by reflecting environmental condition information, driving propensity information, etc. Accordingly, it is necessary to dualize the battery available energy, which indicates a value of the remaining SOC in the battery (110 in FIG. 1) and the converted available energy, which is actually used for calculating the DTE. FIG. 3 is a diagram conceptually illustrating such dualization. Referring to FIG. 3, the x-axis refers to the value of the battery available energy as the actual usable energy, and the y-axis refers to the value of the converted available energy for calculating the DTE.

The converted available energy is generated by matching the environmental condition information, etc. to a predetermined lookup table. When the converted available energy is matched with the battery available energy at a ratio of 1:1, the available energy dual map is generated as in FIG. 3.

In FIG. 3, a straight line 310 refers to a state in which the converted available energy and the battery available energy are matched at a ratio of 1:1. The straight line 310 is the same as the general scheme described in Equation 1. Accordingly, it is the same as using the battery available energy as it is.

Alternatively, a dualization curve 320 is generated by matching the battery available energy and the converted available energy. A dualization branching point 330 for obtaining margin energy is set so that additional driving is possible by a predetermined certain distance on the dualization curve 320. Basically, the smaller the difference between the battery available energy that is the actual available energy and the value of the converted available energy that is the parameter thereof, the more accurate the actual DTE, such that the dualization starts as high energy as possible, thus minimizing the difference between the two values.

In this time, since the battery available energy changes depending on the environmental condition information (e.g., the external temperature) when the charging of the battery has been completed, the environmental condition information is received to start the dualization from a maximum battery available energy point 330 in the corresponding environmental condition information downwards. That is, the lower the temperature, the less battery available energy, such that the starting point of the dualization is identically lowered according to the temperature. Particularly, the starting point where the dualization branching point is started reflects the environmental condition information to become the point that the battery available energy is the maximum value. That is, the starting point where the dualization branching point is started can be changed depending upon the environmental condition.

An example of determining the dualization branching point is illustrated in the following table.

TABLE 1

| | External Temperature [° C.] | | | | |
|---|---|---|---|---|---|
| | −10° C. or less | −10° C.~ 0° C. | 0° C.~ 10° C. | 10° C.~ 20° C. | 20° C. or more |
| Start dualization at the corresponding rate of a total capacity of a battery [%] | 80% | 85% | 90% | 95% | 100% |
| (Ex) 30 kWh capacity battery | 24 kWh | 25.5 kWh | 27 kWh | 28.5 kWh | 30 kWh |

That is, since the battery capacity upon the full charging is lowered as the temperature is lowered, the battery capacity in the state that the charging is completed is controlled to be higher than the point where the dualization is started even at a certain environmental condition (external temperature). That is, the battery output capacity test data at a low temperature is analyzed to set a ratio of the dualization branching point. The dualization branching point is also set to be close to the current total amount while being set to be lower than the current total amount of the battery upon the full charging. Particularly, the dualization branching point can be lowered according to the environmental condition information. That is, as the external temperature is lowered, the total amount of battery upon the full charging can be lowered, such that it is possible to also lower the dualized timing together according to the external temperature, thus maintaining the initial accuracy of the DTE. That is, the initial accuracy of the DTE is maintained only when the dualized timing is lower than the current battery amount.

Figure 4:
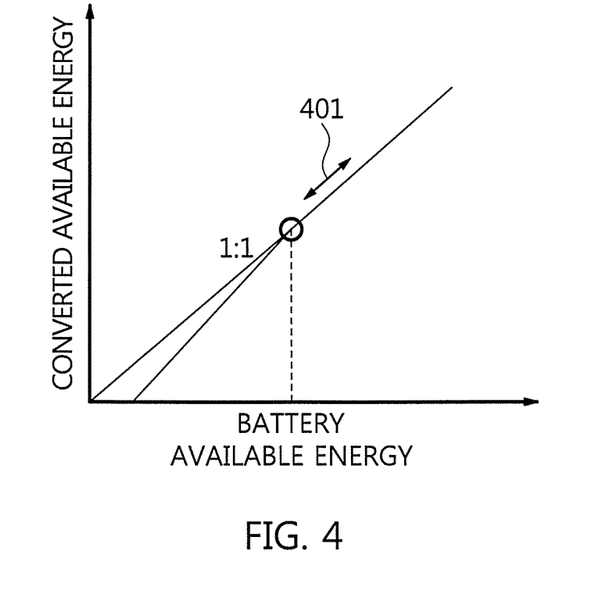
FIG. 4 is an example modifying the upper end of the curve according to FIG. 3.

FIG. 4 is an example modifying the upper end of the curve according to FIG. 3. Referring to FIG. 4, the dualization branching point is further shifted downwards from the dualization branching point 330 illustrated in FIG. 3. That is, the starting point where the dualization branching point 330 is started is further shifted downwards from the starting point illustrated in FIG. 3. That is, FIG. 3 is the dualization branching point 330 at 20° C. or more, and FIG. 4 is the dualization branching point at −10° C. or less. The dualization branching point can be set by shifting like a double arrow 401 according to the environmental condition information.

Figure 5:
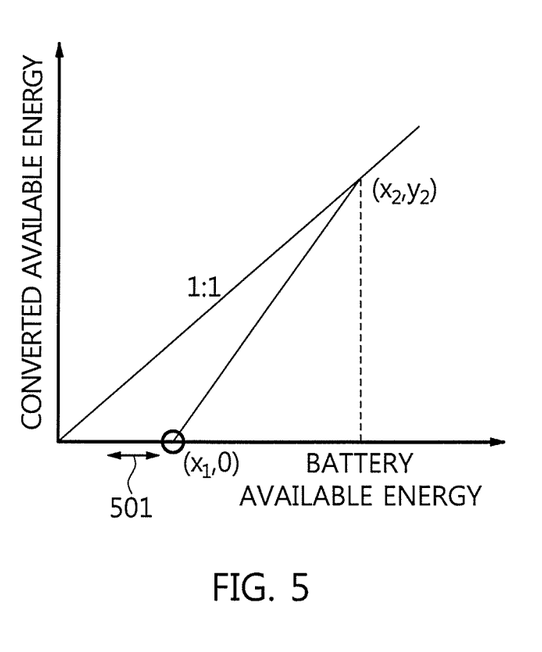
FIG. 5 is a conceptual diagram of a slope setting of a dualization curve in accordance with another embodiment of the present disclosure.

FIG. 5 is a conceptual diagram of a slope setting of a dualization curve in accordance with another embodiment of the present disclosure. Generally, most drivers charge the vehicle before the DTE reaches zero, but can drive until the DTE reaches zero according to a driver's propensity. Accordingly, when the driver frequently drives up to a low DTE, there is a high probability that the vehicle will be completely discharged to stop. Accordingly, when such a driving pattern is shown, a margin 501 is largely left so that there is a certain amount of the converted available energy remaining when the battery available energy reaches 0, and accordingly, a slope thereof can be set so that the driver can find the place to stop even in an emergency. For example, no Distance To Empty (e.g., '---') can be displayed after DTE 1. That is, the DTE is displayed up to about 1 Km, and then the '---' is displayed thereon.

In addition, the slope thereof can be set so that the margin of the converted available energy is large even when the driver frequently drives on the highway rather than driving the city. Since the interval between the charging stations in the highway is wider than that in the city, the margin thereof are made to be larger. Referring to FIG. 5, the slope y' is determined by the following equation.

$$y' = \frac{y_2}{x_2 - x_1}$$ Equation 3

In this time, $(x_2, y_2)$ is determined at the preceding dualization branching point and $(x_1, 0)$ is as follows.

TABLE 2

| | Average Learning Fuel Efficiency of Driver [km/kWh] | | |
|---|---|---|---|
| | 5 km/kWh or less | 5~10 km/kWh | 10 km/kWh or more |
| $x_1$: battery margin energy [kWh] | 0.6 kWh | 0.4 kWh | 0.2 kWh |

That is, the margin energy value of the battery (110 in FIG. 1) is set so that the additional DTE becomes about 2 to 3 km at the display timing of "No Distance To Empty ('---')." That is, the remaining energy value of the battery at the display timing of '---' is flexibly controlled by reflecting driver propensity information. In this time, the driver who mainly drives on the highway can use a value corresponding to 1.5 times the margin energy value by referring to the Vehicle and Driver Management System (VDMS). That is, it is possible to drive by a certain distance even if the driving pattern of the driver is different by reflecting the driver propensity (learning fuel efficiency for each driver). The margin in the highway section having relatively low fuel efficiency is made to be larger by reflecting various weights for each national road/highway. In another embodiment of the present disclosure, the energy margin of the battery has been set to additionally drive by about 2 to 3 km (about 0.2-0.6 kWh), but it can be also used as a counting service system to pay for the differential use by setting it as necessary.

For example, the margin energy can be set to about 80% of the total to provide an electric car rental service that allows the first 20% to be made available for free, and the remaining 80% energy to pay the used amount. For example:
<SOC>
100%→80%: Free use
80%→40%: Paid use
40%→0%: Paid use+additional amount In this time, it is possible to display the usable energy amount and/or the DTE up to each stage.

Figure 6:
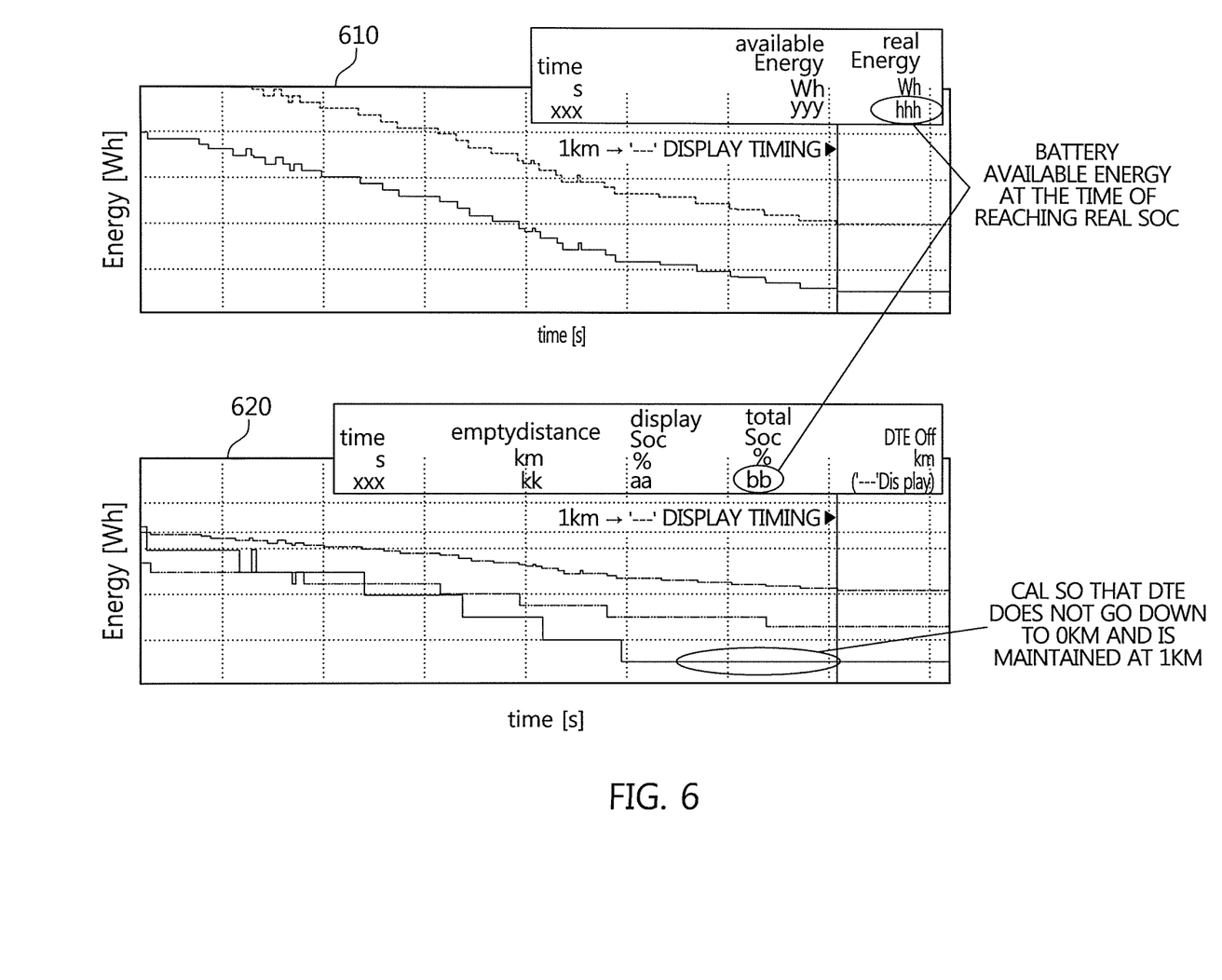
FIG. 6 is a conceptual diagram changing a display timing of a Distance To Empty in accordance with an embodiment of the present disclosure.

FIG. 6 is a conceptual diagram for changing the display timing of the Display To Empty in accordance with an embodiment of the present disclosure. Referring to FIG. 6, in a general case 610, the display timing of '---' is set according to the SOC, not the DTE. Accordingly, the DTE becomes 0 Km when the actual SOC reaches 4.1%.

Alternatively, in accordance with an embodiment of the present disclosure 620, after '---', it is calibrated so that about 400 Wh of the available energy is left. Accordingly, the DTE does not go down to 0 Km and is maintained at 1 Km. In FIG. 6, "CAL" is an abbreviation for calibration.

Figure 7:
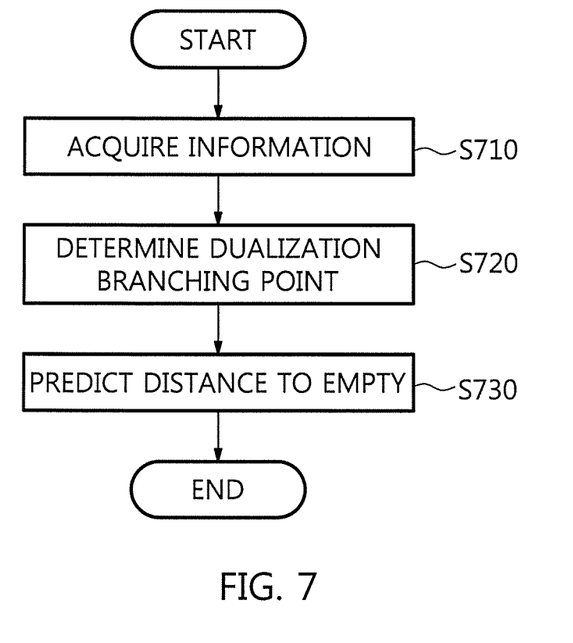
FIG. 7 is a flowchart illustrating a procedure for setting the dualized branching point in accordance with an embodiment of the present disclosure.

FIG. 7 is a flowchart illustrating a procedure for setting the dualized branching point in accordance with an embodiment of the present disclosure. Referring to FIG. 7, the information acquisition module 210 acquires the battery available energy, the environmental condition information, etc. S710. Thereafter, the map generation module 220 generates the converted available energy by reflecting the environmental condition information, etc., generates an available energy dual map including the converted available energy and the battery available energy, and determines a dualization branching point S720. Then, the prediction module 230 predicts the DTE according to the available energy dual map S730.

In addition, the steps of the method or the algorithm explained regarding the embodiments disclosed herein are implemented as a program command format that can be performed through various computers means to be recorded in a computer readable medium. The computer readable medium can include a program (command) code, a data file, a data structure, etc., separately or in a combination thereof.

The program (command) code recorded in the medium can be the ones specially designed or configured for the present disclosure, or can be the one known and available to those skilled in the computer software. Examples of the computer readable medium can include a magnetic media such as a hard disk, a floppy disk, and a magnetic tape, an optical media such as a CD-ROM, a DVD, and a Blue ray, and a semiconductor storage device specially configured to store and perform a program (command) code such as a ROM, a RAM, and a flash memory.

Herein, examples of the program (command) code include a high-level language code that can be executed by a computer using an interpreter, etc., as well as a machine language code made such as those produced by a complier. The hardware device can be configured to operate as one or more software modules in order to perform the operation of the present disclosure, and vice versa.

What is claimed is:

1. An apparatus for providing Distance To Empty (DTE), comprising:
    a sensor for generating environmental condition information;
    a battery control unit for generating battery available energy according to battery state information by sensing a battery; and
    a vehicle control unit for generating an available energy dual map having the battery available energy and converted available energy generated by reflecting the environmental condition information, and for calculating DTE according to the available energy dualization map,
    wherein the vehicle control unit sets a dualization branching point for obtaining margin energy so that additional driving is possible by a certain distance on a dualization curve according to the available energy dualization map.

2. The apparatus of claim 1,
wherein the dualization branching point is set to be lower than a current total amount of the battery upon full charging.

3. The apparatus of claim 1,
wherein a dualization starting point, from which the dualization branching point starts, is changed according to the environmental condition information.

4. The apparatus of claim 1,
wherein a dualization starting point, from which the dualization branching point starts, is a point where the battery available energy is at a maximum value by reflecting the environmental condition information.

5. The apparatus of claim 1,
wherein a slope of the dualization curve is determined by driving propensity information.

6. The apparatus of claim 5,
wherein the driving propensity information is any one of a driving pattern, average learning fuel efficiency for each driver, and a Vehicle and Driver Management System (VDMS).

7. The apparatus of claim 1,
wherein the environmental condition information includes an external temperature.

8. The apparatus of claim 1,
wherein DTE is calculated by using fuel efficiency according to driving of a vehicle and the converted available energy.

9. The apparatus of claim 1, further comprising a display for displaying DTE.

10. A method for providing Distance To Empty (DTE), comprising steps of:
    generating, by a sensor, environmental condition information;
    generating, by a battery control unit, battery available energy according to battery state information by sensing a battery;
    generating, by a vehicle control unit, an available energy dual map having the battery available energy and converted available energy generated by reflecting the environmental condition information; and
    calculating, by the vehicle control unit, DTE according to the available energy dual map,
    wherein the step of calculating comprises setting a dualization branching point for obtaining margin energy so that additional driving is possible by a certain distance on, a dualization curve according to the available energy dual map by the vehicle control unit.

11. The method of claim 10,
wherein the dualization branching point is set to be lower than a current total amount of the battery upon full charging.

12. The method of claim 10,
wherein a dualization starting point, from which the dualization branching point starts, is changed according to the environmental condition information.

13. The method of claim 10,
wherein a dualization starting point, from which the dualization branching point starts, is a point where the battery available energy is at a maximum value by reflecting the environmental condition information.

14. The method of claim 10,
wherein a slope of the dualization curve is determined according to driving propensity information.

15. The method of claim 14,
wherein the driving propensity information is any one of a driving pattern, average fuel efficiency for each driver, and a vehicle and driver management system (VDMS).

16. The method of claim 10,
wherein the environmental condition information includes an external temperature.

17. The method of claim 10,
wherein DTE is calculated by using fuel efficiency according to driving of a vehicle and the converted available energy.

18. The method of claim 10,
wherein the step of calculating further comprises displaying DTE on a display.

* * * * *